(12) United States Patent
Toender et al.

(10) Patent No.: US 11,442,089 B2
(45) Date of Patent: Sep. 13, 2022

(54) APPARATUS AND METHOD FOR DETERMINING A TRIGGER TIME

(71) Applicant: Rohde & Schwarz GmbH & Co. KG, Munich (DE)

(72) Inventors: Nico Toender, Haar (DE); Johann Huber, Markt Schwaben (DE); Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 253 days.

(21) Appl. No.: 16/597,370

(22) Filed: Oct. 9, 2019

(65) Prior Publication Data

US 2021/0109144 A1    Apr. 15, 2021

(51) Int. Cl.
  *G01R 23/00*    (2006.01)
  *H04B 1/06*    (2006.01)

(52) U.S. Cl.
  CPC ............. *G01R 23/005* (2013.01); *H04B 1/06* (2013.01)

(58) Field of Classification Search
  CPC .................................. G01R 23/005; H04B 1/06
  See application file for complete search history.

(56) References Cited

U.S. PATENT DOCUMENTS

| | | | |
|---|---|---|---|
| 7,072,804 B2 | 7/2006 | Weller | |
| 7,610,178 B2 | 10/2009 | Veith et al. | |
| 7,729,679 B1* | 6/2010 | Lee | H04B 1/1027 455/295 |
| 8,487,607 B2 | 7/2013 | Kuhwald et al. | |
| 2009/0080906 A1* | 3/2009 | Tao | H04B 10/61 398/209 |
| 2010/0045260 A1 | 2/2010 | Kuhwald et al. | |
| 2010/0098263 A1* | 4/2010 | Pan | G10K 11/17825 381/94.1 |

FOREIGN PATENT DOCUMENTS

EP      2 016 428 B1    1/2009

* cited by examiner

*Primary Examiner* — Yuwen Pan
*Assistant Examiner* — Fatuma G Sherif
(74) *Attorney, Agent, or Firm* — Westman, Champlin & Koehler, P.A.

(57) ABSTRACT

Improved determination of a trigger time. For this purpose, an input signal is provided to multiple low pass filters having different bandwidths. A trigger event is detected in each of the low pass filtered signals and a corresponding trigger time is determined. The trigger time which is determined based on valid trigger detection and provided by the low pass filter with the highest bandwidth is used for further analysis.

16 Claims, 2 Drawing Sheets

APPARATUS AND METHOD FOR DETERMINING A TRIGGER TIME

TECHNICAL FIELD

The present invention relates to an apparatus for determining a trigger time. The present invention further relates to a method for determining a trigger time. In particular, the present invention relates to determining a point in time of a trigger event in a digital signal.

BACKGROUND

Although applicable in principal to any signal, the present invention and its underlying problem will be hereinafter described in combination with a measurement signal of a measurement system.

When analyzing signals, such as measured signals of a measurement system, a point of time when a specific event occurs may be of high importance. Especially, a precise knowledge of the point of time when a trigger event occurs should be determined as precise as possible. However, due to many effects, for example noise or limited quantization of an analog to digital converter, a point of time when a specific trigger event occurs (also called trigger time) can be determined only with limited accuracy.

For example, when an analog signal is converted to a digital signal, a specific sampling rate is applied. Thus, the accuracy of the trigger time is limited at least by this sampling rate. Further to this, additional disturbances such as noise or the like may also have impact to the accuracy of determining the trigger time.

Against this background, a problem addressed by the present invention is to provide an improved approach for a precise determination of a trigger time.

SUMMARY

The present invention solves this object by an apparatus and a method for determining a trigger time with the features of the independent claims. Further advantageous embodiments are subject matter of the dependent claims.

According to a first aspect, an apparatus for determining a trigger time is provided. The apparatus comprises an input port, a number of at least two detection paths and a selector. The input port is configured to receive an input signal. In particular, a digital input signal may be received. The digital input signal may be a signal which is obtained by an analog to digital conversion of an analog signal. Each detection paths of the at least two detection paths, comprises a low pass filter and a trigger detector. In particular, the output of the low pass filter may be connected to the input of the trigger detector in each trigger path. Furthermore, an input of the low pass filter may be connected to the input port of the apparatus. Each low pass filter may have a bandwidth which is different from the bandwidth of the other low path filters of the at least two detection paths. Furthermore, each low pass filter may be configured to apply a low pass filtering of the received input signal. The low pass filtered signal is provided to the related trigger detector.

Each trigger detector is configured to identify a predetermined trigger event. Further, each trigger detector may determine a trigger time of the identified trigger event. The selector of the apparatus may be configured to receive the determined trigger times from the trigger detectors of the detection paths and output one of the received trigger times.

According to a further aspect, a method for determining a trigger time is provided. The method comprises a step of receiving an input signal. In particular, the input signal may be received by an input port. The method further comprises steps of low pass filtering the received input signals by a number of two or more low pass filters. In particular, each low path filter may have a bandwidth which is different from the other low pass filters. Further, the method comprises steps of determining a trigger time for each of the identified trigger events. The detection of the trigger events and the determination of the trigger time may be performed by a trigger detector. Further, the method comprises a step of selecting one of the determined trigger times and outputting the selected trigger time. The selection of the trigger time and the outputting of the selected trigger time may be performed by a selector.

As already discussed above, a precise determination of a point of time when a trigger event occurs is great importance. For example, measured signals, in particular signal waveforms may be analyzed in association with one or more specific trigger events. It is understood that the trigger time is also important for many other applications.

However, as also mentioned above, the accuracy for determining the trigger time of a signal, in particular of a digital signal which is obtained by an analog to digital conversion, may be limited. Especially, if a signal comprises segments with different characteristics such as high frequency components and low frequency components, for example rising or falling edges with short rising time and further edges with a relative long rising time, it may be rather difficult to use a common configuration for identifying the correct trigger time in all segments of the signal.

Thus, the present invention takes into account this finding and aims to provide an apparatus and a method for a precise determination of a trigger time for any kind of signals, in particular signals having segments with short rising times (which may relate to high frequency components) and segments with long rising times (relating to lower frequency components).

It is for this purpose that a number of two or more trigger paths are provided, wherein each of the multiple trigger paths has a different characteristic. In particular, each trigger path comprises a low pass filter with a different bandwidth. Thus, the cut-off frequency of each low pass filter is different from the cut-off frequencies of the other low pass filters.

For example, multiple trigger paths may be arranged with an increasing or decreasing bandwidth (and a related cut-off frequency) for each low pass filter of the respective trigger path. Accordingly, each trigger path may be considered as a path for identifying the trigger time for signals with specific characteristics. Hence, by selecting the determined trigger time provided by an appropriate trigger path, the accuracy of the trigger time related to a specific trigger event can be improved.

The low pass filter may be any kind of appropriate filter for performing a low pass filtering, i.e. cancelling or damping high frequency components in the signal. Since the input signal is a digital signal, the low pass filter may be applied as a digital filter. For this purpose, any kind of appropriate digital filtering may be applied. The bandwidths and the related cut-off frequencies of the low pass filters may be fixed. Accordingly, a fixed bandwidth/cut-off frequency may be set for each low pass filter. As already mentioned above, the bandwidths/cut-off frequencies of the low pass filters in the trigger paths may be all different. However, it may be also possible that the bandwidths of the individual low pass filters may be adjustable. Even if the bandwidths of the low pass filters are adjustable, the low pass filter of each trigger path may have a different bandwidth.

Each trigger detector may be connected to a related low pass filter and analyze the respective low pass filtered input signal in order to detect a predetermined trigger event. Such a trigger event may be, for example, a rising or falling edge, a signal value above or below a specific level, or any other kind of predetermined characteristic in the input signal.

When a trigger detector identifies a predetermined trigger event, the trigger detector further determines the related point in time when the trigger event has been detected. For this purpose, the trigger detectors may be connected to a common clock, for example a real-time clock or the like in order to obtain a precise time basis. In particular, the time basis for determining the trigger time may be synchronized with the time basis of the input signal. In this way, the trigger detector can determine a time stamp of a detected trigger event.

Accordingly, it may be possible that one or more trigger detectors of the trigger paths may identify a same trigger event. Accordingly, each trigger detector may individually determine a corresponding time stamp. Thus, all trigger detectors which have identified a trigger event may provide the related time stamp to the selector. In this case, the selector may select one of the provided time stamps of a trigger event and output only one time stamp from one of the multiple trigger paths. The remaining time stamps may be discarded. In particular, the selector may select the time stamp of the trigger path with the low pass filter having the highest bandwidth.

For example, the selector may be a multiplexer or the like. Such a multiplexer may comprise multiple input ports. Further, the multiplexer may connect one of the input ports to the output port in order to output the signal of the related input port. However, it is understood, that the selector may be also realized by any other appropriate configuration.

The low pass filters, the trigger detectors and/or the selectors may be realized by one or more processors. For example, the one or more processors may be connected to a memory for providing appropriate instructions in order to perform the desired operations. In particular, the one or more processors may execute an operating system which loads and executes the instructions in order to perform the desired operations. However, it is understood, that the low pass filters, the trigger detectors and the selectors may be also realized in any other appropriate manner.

Further embodiments of the present invention are subject of the further subclaims and of the following description referring to the drawings.

In a possible embodiment, the apparatus may comprise a further trigger detector. The further trigger detector may be directly connected to the input port. In particular, the further trigger detector may be configured to identify the predetermined trigger event. The further trigger detector may also determine a further trigger time of the identified trigger event. In this case, the selector may be configured to receive also the determined further trigger time from the further trigger detector and output either one of the received trigger times from the trigger detectors of the trigger paths or the further trigger time from the further trigger detector.

Accordingly, further to the trigger detectors which identify a trigger event based on low pass filtered signals, an addition path may be provided without filtering the input signal. In this way, it is possible to apply a trigger event detection based on the original input signal. Thus, if a trigger event may be such that it can not be detected in a low pass filtered signal, the trigger event may be identified by the further trigger detector in the unfiltered signal. In this way, it is possible to achieve a detection of a wide range of trigger events.

In a possible embodiment, the apparatus may further comprise a controller. The controller may be configured to control the selector. In particular, the controller may control the selector to output one of the trigger times provided from the trigger detectors and the trigger times from the further trigger detector. In particular, the controller may control the selector such that the selector outputs a trigger time when the further trigger detector has detected a predetermined trigger event.

The further trigger detector analyzes the unfiltered input signal, this unfiltered input signal is a reliable basis for identifying trigger events. Additionally, the accuracy of the trigger time may be further improved by determining the trigger time based on the filtered signals. Thus, on the one hand side the reliability for identifying a trigger event is improved, and on the other hand side, the accuracy of the trigger time of such a trigger event can be enhanced.

In a possible embodiment, each trigger detector of the number of trigger paths is configured to provide a trigger detection signal. The trigger detection signals are provided when the respective trigger detector detects a predetermined trigger event. In this case, the controller may be configured to control the selector to output only the trigger time of the trigger path providing a trigger detection signal. Further to this, the controller may select the trigger path which provides a trigger detection signal and which has the low path filter with the highest bandwidth. Thus, the trigger time of the trigger path is selected which indicates the trigger detection signal and which has the low pass filter with the highest bandwidth.

In a possible embodiment, each trigger path may further comprise a validation unit. The validation unit may be configured to validate the detection of the predetermined trigger event in the respective trigger path. If the detection of the trigger event is valid, the validation unit may provide a control signal in case that the detection fulfills a predetermined condition.

Accordingly, if the trigger detection does not fulfill the requirements for a reliable trigger detection, no control signal is provided, and consequently, the trigger detection and a provided time stamp of the respective trigger path may be discarded. In this way, it can be ensured that only reliable trigger times are taken into account.

In a possible embodiment, the controller may be configured to control the selector such that the selector outputs the trigger time of a trigger path providing a control signal. Accordingly, the controller selects a trigger path indicating detection of a trigger event and providing a control signal. In case more than one trigger path provide an indication of a trigger detection and a valid control signal, the trigger path with the low pass filter having the highest bandwidth is selected.

In a possible embodiment, the validation unit comprises a delay element for applying a predetermined delay to the input signal. In particular, the delay may correspond to the delay of the low pass filter in the related trigger path.

Accordingly, the low pass filtered signal and the signal of the delay element may be the same. The validation unit may further comprise a subtraction element. The subtraction element may determine a difference between the filtered input signal and the delayed input signal in the respective trigger path. Further, the validation unit may comprise an averaging device. The averaging device may generate an average value of the determined difference. In particular, the average may be determined over a predetermined period of time. For example, the averaging device may compute a mean value over a specific period of time. In particular, a mean value of a squared amount may be computed. Further, the validation unit may comprise a comparator. The comparator may compare the average value with a predetermined threshold level. If the average value is below the threshold level, the determination of the trigger events and the trigger time may be considered to be valid, and a related control value may be output. Otherwise, if the average value exceeds the threshold level, the determination of the trigger time in the respective trigger path may be considered to be not valid.

In a possible embodiment, the controller may be configured to control the selector to output the trigger time of the further trigger detector, if no control signal is provided by any of the trigger paths and/or no trigger event is detected in any of the trigger paths.

Thus, in case that no reliable determination of a trigger time can be performed in any of the trigger paths, the trigger time is determined based on the unfiltered input signal by the further trigger detector. Hence, it is even possible to identify an appropriate trigger event and a related trigger time, for a wide range of signals.

With the present invention it is therefore now possible to achieve a very precise determination of trigger time for a trigger event. In particular, a precise determination of a trigger time in a digitized input signal can be achieved for a wide range of signals. In case a trigger event relates to a relative low changing signal, the accuracy of the trigger time can be improved by considering a low pass filtered signal. For signals having characteristics which are changing faster, an appropriate determination of the trigger time by means of low pass filters having a lower bandwidth can be performed. And finally, if the trigger event relates to a very fast changing characteristic, even an unfiltered signal may be taken into account for determining an appropriate trigger time. Hence, in any case a very precise trigger time can be identified.

DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
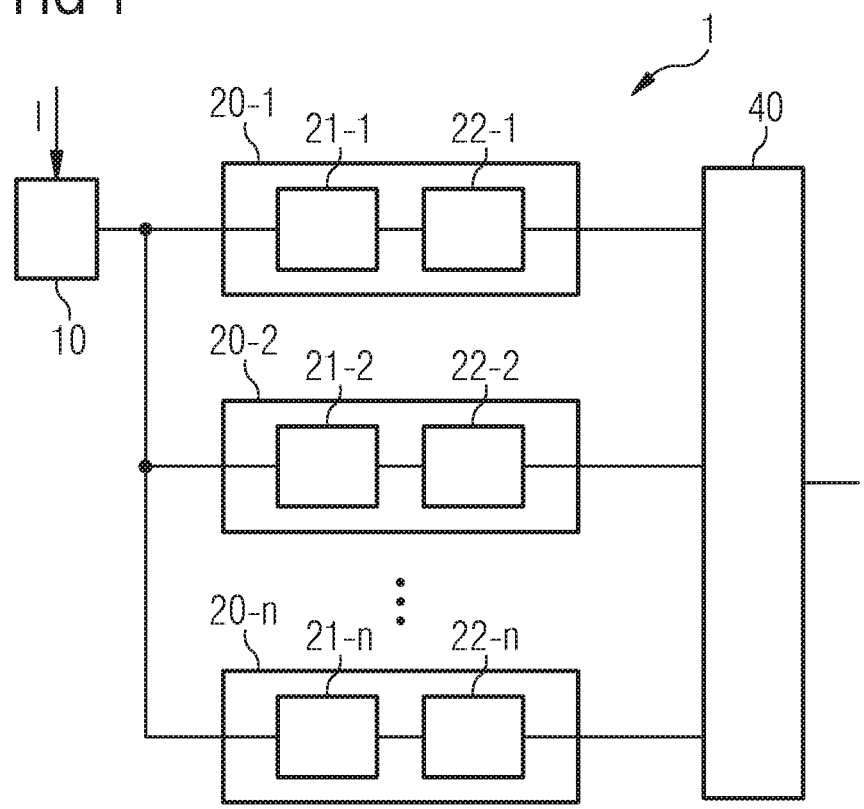
FIG. 1 shows a block diagram of an embodiment of a test apparatus according to the present invention.

The appended drawings are intended to provide further understanding of the embodiments of the invention. They illustrate embodiments and, in conjunction with the description, help explaining principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a block diagram of an apparatus 1 for determining a trigger time. The apparatus 1 comprises an input port 10 for receiving an input signal I. The input signal may be any kind of signal, in particular any kind of digital signal. For example, the input signal may be a signal which is obtained from an analog signal by an analog to digital conversion. For this purpose, any kind of analog to digital converter may be used. The input signal I which is received by the input port 10 may be forwarded to multiple trigger paths 20-*i*.

Even though only three trigger paths 20-*i* as shown in FIG. 1, the present invention is not limited to a number of three trigger paths 20-*i*. Moreover, any number of at least two trigger paths 20-*i* is possible.

Each trigger path 20-*i* may individually analyze the input signal I in order to identify a trigger event and determine a corresponding trigger time for specifying the point of time when the detected trigger event occurs. For this purpose, each trigger path 20-*i* may comprise a low pass filter 21-*i* and a trigger detector 22-*i*. An input of the low pass filter 21-*i* may be electrically connected to the input port 10. An output port of the low pass filter 21-*i* may be connected to an input of the related trigger detector 22-*i* of the respective trigger path 20-*i*.

Each low pass filter 21-*i* of a trigger path 20-*i* may have a bandwidth which is different from the bandwidths of the low pass filters 21-*i* of the other trigger paths 20-*i*. Accordingly, first low pass filter 21-1 may have a bandwidth which is different from the bandwidths of the other low pass filters 21-2 to 21-*n*. For example, the low pass filters 21-*i* may have increasing or decreasing bandwidths. Accordingly, each low pass filter 21-*i* has a different cut-off frequency.

The low pass filters 21-*i* may be realized in any appropriate manner. For example, the low pass filters 21-*i* may be realized as digital filters. In particular, each low pass filter 21-*i* may have a fixed, preset bandwidth/cut-off frequency. Alternatively, it may be also possible that the bandwidths/cut-off frequencies of the low pass filters 21-*i* may be adjustable. However, even if the bandwidth/cut-off frequency of the low pass filters 21-*i* is adjustable, the bandwidth may be set such that each low pass filter 21-*i* has a different bandwidth.

The output of the low pass filters 21-*i* is connected to an input of the related trigger detector 22-*i* in the respective trigger path 20-*i*. The trigger detector 22-*i* may identify a predetermined trigger event in the filtered input signal. The trigger event may be any kind of predetermined trigger event. For example, a trigger event may be a rising or falling edge, a signal value which exceeds or falls below a predetermined value, or any other characteristic in the respective signal. It is understood, that the trigger detectors 22-*i* may identify only one specific trigger event, or may also identify a number of two or more predetermined trigger events. Furthermore, it may be even possible that a trigger event may relate to a sequence of multiple characteristics in an arbitrary or specific order.

When a trigger detector 22-*i* detects a predetermined trigger event, the respective trigger detector 22-*i* determines a corresponding point in time when the respective trigger event occurs. For this purpose, the trigger detectors 22-*i* may be provided with a common time basis. For example, the trigger detectors 22-*i* may be connected with a clock such as a real-time clock or the like (not shown). However, any other scheme for providing a common time basis to the trigger detectors 22-*i* may be also possible. For example, a specific time code may be assigned to the input signal which may be used as a common time basis for the trigger detectors 22-*i*. In any case, the trigger detectors 22-*i* may determine a trigger time TS-*i* which specifies the point in time when the detected trigger event occurs. This trigger time may be provided to a selector 40 as time information TS-i.

Accordingly, if the trigger detectors 22-i in multiple trigger paths 20-i identify a same trigger event, each trigger detector 22-i may provide a respective time information TS-i to the selector 40.

Selector 40 may receive the time information TS-i from all trigger detectors 22-i which have identified the respective trigger event. Further, selector 40 may select one of time information TS-i and output the selected time information. In particular, selector 40 may select the time information TS-i of the trigger path 20-i with the low pass filter 21-i having the highest bandwidth.

In order to further improve the accuracy and the reliability of the trigger time, the determination of the trigger events and the corresponding trigger times may be validated as will be described in more detail below.

Figure 2:
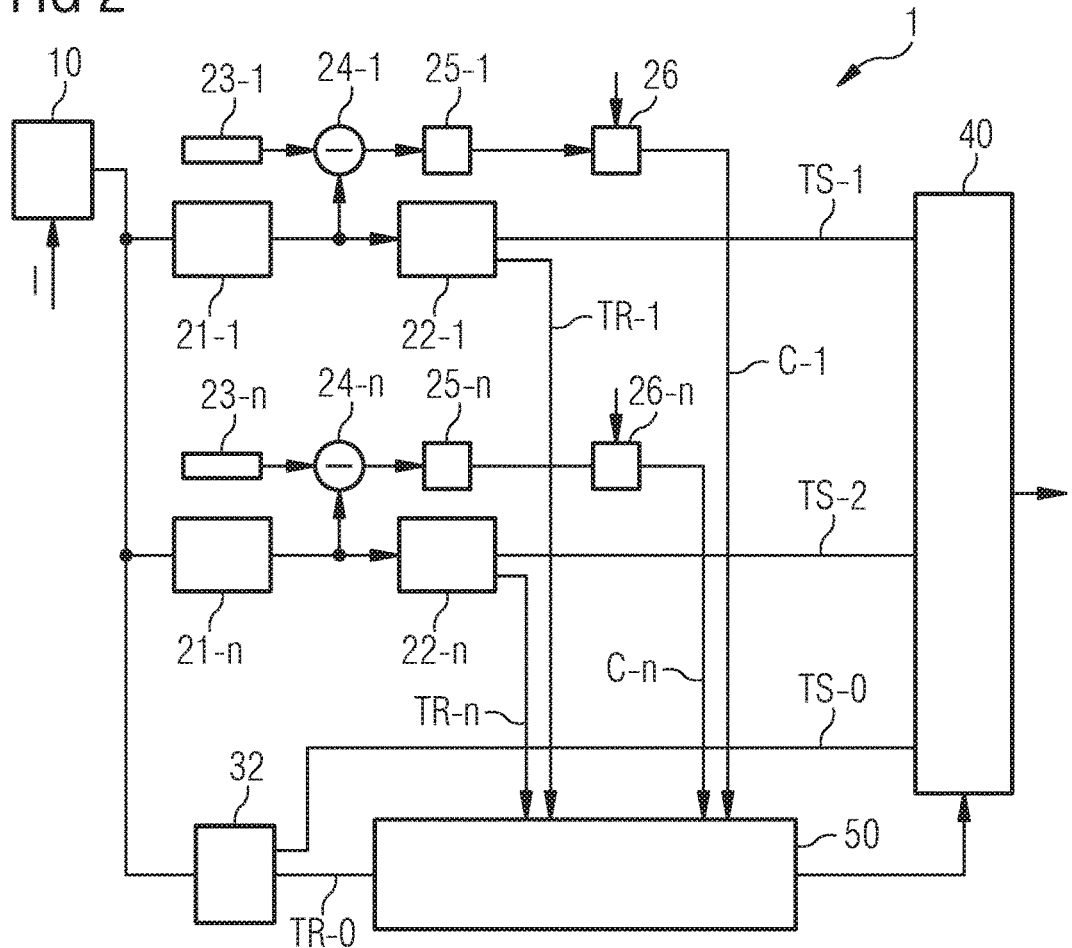
FIG. 2 shows a block diagram of a further embodiment of an apparatus according to the present invention.

FIG. 2 shows a schematic block diagram of an apparatus 1 for determining a trigger time according to a further embodiment. In this embodiment, the explanation as has been already provided above in connection with FIG. 1 also applies to the configuration according to FIG. 2.

As can be seen in FIG. 2, the apparatus 1 may comprise a further trigger detector 32 which is directly connected to input port 10. Accordingly, further trigger detector 32 may analyze the unfiltered input signal I in order to identify a trigger event and determine a corresponding time stamp information TS-0.

Further to this, apparatus 1 may additionally comprise a controller 50 for controlling the selection of the time stamp information TS-i by selector 40. The selection of the respective time stamp information TS-i may be based on the identification of a trigger signal by the further trigger detector 32. Additionally, further signal provided by the elements of the trigger paths 20-i may be also taken into account by controller 50.

For example, each trigger detector 22-i may provide an indication TR-i when the respective trigger detector has identified a predetermined trigger event. Additionally, the further trigger detector 32 may also provide such indication TR-0 when the further trigger detector 32 has identified a trigger event. In this way, each trigger detector 22-i and the further trigger detector 32-i provide an indication TR-i when the respective trigger detector 22-i has identified a trigger event. Accordingly, controller 50 may use these indications in order to select the time stamp information TS-i of one of the trigger paths 20-i. As already explained above, controller 50 may select the time stamp information TS-i of the trigger paths 20-i with the low pass filter 21-i having the highest bandwidth. If only the further trigger detector 32 has identified a trigger event, but none of the trigger detectors 22-i has identified a trigger event, the trigger time TS-0 of the further trigger detector 32 may be selected.

Further to this, a validation of the trigger detection may be performed. For this purpose, each trigger path 20-i may comprise a validation unit with a delay element 23-i, a subtraction element 24-i, an averaging device 25-i and a comparator 26-i. Each validation unit may provide a control signal C-i for indicating whether or not the respective detection path 20-i provides a reliable detection of a trigger event and a related trigger time TS-i. However, it is understood, that the validation unit may be also realized by another appropriate configuration for providing a control signal C-I for indicating the reliability of the trigger detection.

Each delay element 23-i may receive the input signal from input port 10 and apply a temporal delay to the input signal I. In particular, the temporal delay of the respective delay element 23-i may correspond to the delay of the corresponding low pass filter 21-i in the respective trigger path 20-i. Subtraction element 24-i may receive the delayed input signal from delay element 23-i and the low pass filtered input signal from low pass filter 21-i and provide a difference of the filtered input signal and the delayed input signal. This difference is provided to averaging device 25-i. Averaging device 25-i may generate an average value of the difference over a specific period of time. In particular, the specific period of time may be a relative short period of time. For example, the average may be computed by determining a mean value of the squared amount of the difference provided by subtraction element 24-i.

The average value is provided to comparator 26-i. Comparator 26-i compares the average value with a threshold limit. In particular, the threshold limit may be specified individually for each detection path 20-i.

If the average value is below the specific threshold value, the detection of a trigger event and the determination of the trigger time is considered to be valid. Thus, comparator 26-i may output a respective control value C-i. The control value C-i may be provided to controller 50. Otherwise, if the average value is higher than the threshold level, the detection of the trigger event and the determination of the trigger time TS-i in the respective trigger path is considered to be not valid.

Accordingly, by providing the control signals C-i from the validation units to the controller 50, controller 50 may only take into account those trigger paths 20-i which provide a respective control signal C-i indicating a reliable detection of the trigger events and the respective trigger times.

Thus, when the further trigger detector 32 detects a trigger event and indicates this detection by respective signal TR-0 to controller 50, controller 50 analyzes the control signals C-i. In particular, only trigger paths 20-i are taken into account which provide a valid trigger detection. Further to this, controller 50 may analyze which trigger detectors 22-i indicate a detection of a trigger signal by a respective signal TR-i. If a valid trigger detection is performed by one or more of the trigger paths 20-i, the trigger path with the low pass filter 21-i is selected which has the low pass filter 22-I having the highest bandwidth. If none of the trigger paths 20-i indicates a valid trigger detection, the trigger time TS-0 of the further trigger detector 32 is used.

Figure 3:
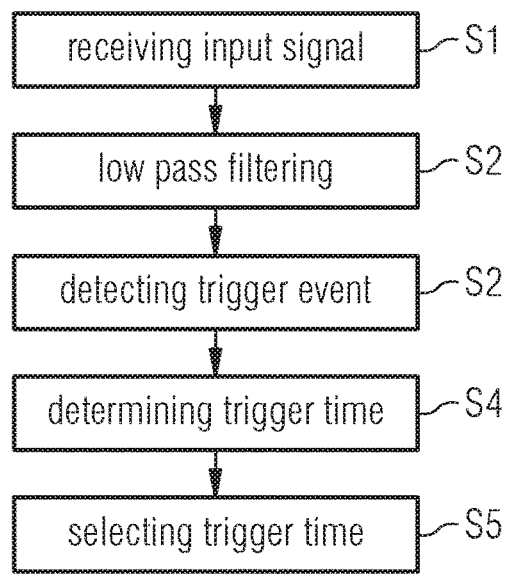
FIG. 3 shows a flow diagram illustrating a method according to an embodiment.

FIG. 3 shows a flow diagram of a method for determining a trigger time according to an embodiment. The method may perform any step as described above in connection with the apparatus 1 for determining a trigger time. Furthermore, the apparatus 1 for determining the trigger time may also comprise any kind of devices for performing operations as will be described below in connection with the method.

In a step S1, an input signal I may be received. In particular, the input signal may be received by an input port 10.

In step S2, low pass filtering may be applied to the received input signals by a number of two or more low pass filters 21-i. Each low pass filter 21-i may have a bandwidth which is different from the bandwidths of the other low pass filters 21-i.

In step S3, a predetermined trigger event may be detected in the low pass filtered signals. Further, in step S4 a trigger time TS-i may be determined for each identified trigger event. The detection of the trigger events and the determination of the trigger times TS-i may be performed by a trigger detector 22-i.

In step S5, one of the determined trigger times TS-i may be selected and the selected trigger time TS-i may be output. The selection and the output of the trigger time TS-i may be performed by a selector 40.

Further, the predetermined trigger event may be also detected in the unfiltered input signal by a further trigger detector 32. Accordingly, a further trigger time may TS-0 be determined for the trigger event in the unfiltered signal. Accordingly, the selector 40 may select either the trigger time TS-i which is determined in one of the filtered signals or the further trigger time TS-0 of the unfiltered signal.

The selection of the trigger time TS-i may be performed when the further trigger detector 32 has detected a predetermined trigger event.

Further to the determination of the trigger times TS-i, a signal TR-I for indicating the detection of a trigger event may be provided by each trigger detector 22-i. Accordingly, the selection of the respective trigger time TS-i may be based on the indicated detection of a trigger event.

Additionally, it may be possible to validate the detection of a trigger event and the determination of a trigger time and to provide a control signal C-I for indicating the validation.

In particular, the validation may be based on a delayed input signal, wherein the input signal I may be delayed by a time corresponding to the time delay of the corresponding low pass filtering. The difference between the delayed signal and the low pass filtered signal may be averaged, and this average value may be compared with a threshold level. In case the average value is below the threshold value, the determination of the trigger time in the respective path is considered to be valid.

Accordingly, if at least one of the trigger times TS-i based on the low pass filtered signal is considered to be valid, the trigger time TS-i which is determined based on a low pass filtered with a low pass filter having the highest bandwidth is selected. Otherwise, if none of the low pass filtered signal provides a valid trigger time TS-i, the trigger time TS-0 which is determined based on the unfiltered signal is used.

Summarizing, the present invention relates to an improved determination of a trigger time. For this purpose, an input signal is provided to multiple low pass filters having different bandwidths. A trigger event is detected in each of the low pass filtered signals and a corresponding trigger time is determined. The trigger time which is determined based on valid trigger detection and provided by the low pass filter with the highest bandwidth is used for further analysis.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not in-tended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

1 apparatus
10 input port
20-i trigger paths
21-i low pass filter
22-i trigger detector
23-i delay element
24-i subtracting element
25-i averaging element
26-i comparator
32 further trigger detector
40 selector
50 controller
TS-i timestamp information
TR-i trigger indication
C-i control/validation signal
S1-S5 method steps

The invention claimed is:

1. An apparatus for determining a trigger time, the apparatus comprising:
an input port for receiving an input signal;
a number of at least two detection paths,
each detection path comprising a low pass filter and a related trigger detector,
wherein the low pass filter of each detection path has a different bandwidth, each low pass filter is electrically connected to the input port, and configured to apply a low pass filtering of the input signal and provide the filtered signal to the related trigger detector, and
each related trigger detector is configured to identify a predetermined trigger event and to determine a trigger time of the identified trigger event, wherein said trigger time specifying a point in time when the identified predetermined trigger event has been identified; and
a selector for receiving the determined trigger times from the trigger detectors, selecting a trigger time of a trigger path with a low pass filter having the highest bandwidth among the received trigger times, and outputting the selected trigger time.

2. The apparatus of claim 1, comprising a further trigger detector which is directly connected to the input port, the further trigger detector is configured to identify the predetermined trigger event and determine a further trigger time of the identified trigger event based on the input signal received on the input port, wherein the selector is configured to receive the determined further trigger time from the further trigger detector and output one of the received trigger times or the further trigger time.

3. The apparatus of claim 2, comprising a controller configured to control the selector to output one of the provided trigger times when the further trigger detector has detected a predetermined trigger event.

4. The apparatus of claim 3, wherein each trigger detector of the number of trigger paths is configured to provide a trigger detection signal when the predetermined trigger event is detected by the respective trigger detector, and the controller is configured to control the selector to output the trigger time of the trigger path providing a trigger detection signal and having the low path filter with the highest bandwidth.

5. The apparatus of claim 4, wherein each trigger path comprises a validation unit for validating the detection of the predetermined trigger event in the respective trigger path and providing a control signal if the detection fulfills a predetermined condition.

6. The apparatus of claim 5, wherein the controller is configured to control the selector to output the trigger time of a trigger path providing a control signal.

7. The apparatus of claim 5, wherein each validation unit comprises:
- a delay element for applying a predetermined delay to the input signal,
- a subtraction element for determining a difference between the filtered input signal and the delayed input signal,
- an averaging device for generating an average value of the determined difference over a predetermined time period, and
- a comparator for comparing the average value with a threshold level.

8. The apparatus of claim 5, wherein the controller is configured to control the selector to output the trigger time of the further trigger detector, if no control signal is provided by any of the trigger paths and/or no trigger event is detected in any of the trigger paths.

9. A method for determining a trigger time, the method comprising:
receiving an input signal by an input port;
low pass filtering the received input signal by a number of two or more low pass filters,
wherein each low path filter has a different bandwidth;
detecting a predetermined trigger event in each of the low pass filtered signals by a trigger detector;
determine a trigger time for each of the identified trigger events by the trigger detector,
wherein said trigger time specifying a point in time when the detected
predetermined trigger event has been detected;
receiving the determined trigger times from the trigger detectors;
selecting a trigger time of a trigger path with a low pass filter having the highest bandwidth among the received trigger times;
outputting the selected trigger time by a selector.

10. The method of claim 9, comprising identifying the predetermined trigger event based on the unfiltered received input signal received on the input port; and
determining a further trigger time of the identified trigger event based on the unfiltered received input signal.

11. The method of claim 10, comprising controlling the selection of a trigger time, and outputting one of the trigger times when a trigger event has been detected in the unfiltered received input signal.

12. The method of claim 11, comprising a step of providing a trigger detection signal when the predetermined trigger event is detected, and
outputting the trigger time of a trigger path providing a trigger detection signal and having the highest bandwidth of the low pass filtering.

13. The method of claim 12, comprising a step of validating the detection of the predetermined trigger event in the respective trigger path and providing a control signal if the detection fulfills a predetermined condition.

14. The method of claim 13, wherein the trigger time of the trigger path is output which provides a control signal.

15. The method of claim 13, the validation in each trigger path comprises:
applying a predetermined delay to the input signal,
determining a difference between the filtered input signal and the delayed input signal,
generating an average value of the determined difference over a predetermined time period, and
comparing the average value with a threshold level.

16. The method of claim 13, the trigger time relating to the unfiltered received input signal is output, if no control signal is provided by any of the trigger paths and/or no trigger event is detected in any of the trigger paths.

* * * * *